United States Patent
Tsuruko

(10) Patent No.: US 9,186,898 B2
(45) Date of Patent: Nov. 17, 2015

(54) METHOD FOR PRODUCING PIEZOELECTRIC ACTUATOR

(75) Inventor: Masanori Tsuruko, Nagoya (JP)

(73) Assignee: Brother Kogyo Kabushiki Kaisha, Nagoya-shi, Aichi-ken (JP)

(*) Notice: Subject to any disclaimer, the term of this patent is extended or adjusted under 35 U.S.C. 154(b) by 1535 days.

(21) Appl. No.: 12/057,162

(22) Filed: Mar. 27, 2008

(65) Prior Publication Data
US 2008/0235927 A1    Oct. 2, 2008

(30) Foreign Application Priority Data

Mar. 28, 2007 (JP) ................. 2007-083564

(51) Int. Cl.
*B41J 2/16* (2006.01)
*H01L 41/314* (2013.01)
(Continued)

(52) U.S. Cl.
CPC *B41J 2/161* (2013.01); *B41J 2/164* (2013.01); *B41J 2/1623* (2013.01); *B41J 2/1642* (2013.01); *B41J 2/1646* (2013.01); *H01L 41/0973* (2013.01); *H01L 41/29* (2013.01);
(Continued)

(58) Field of Classification Search
CPC .......... B41J 2/161; B41J 2/164; B41J 2/1642; B41J 2/1646; H01L 41/29; H01L 41/314; H01L 41/316; H01L 41/319; H01L 41/312; H01L 41/37; C01B 33/113; C23C 18/12; C23C 18/1208; C23C 18/1216; H03H 3/00; H03H 3/02; H03H 2003/023; H03H 3/03; Y10T 29/42; Y10T 29/49155; Y10T 29/49401
USPC ................. 29/890.1, 25.35, 846; 347/68–71; 427/100, 248.1, 453, 372.2, 383.1, 427/383.5, 255.27; 264/414; 556/51; 438/785, 787
See application file for complete search history.

(56) References Cited

U.S. PATENT DOCUMENTS 3,944,683 A * 3/1976 Church et al. ............ 427/453 X
5,147,587 A * 9/1992 Marcus et al. ............ 264/414 X
(Continued)

FOREIGN PATENT DOCUMENTS

JP    60062164 A *  4/1985  ............ 29/25.35 X
JP    64002382 A *  1/1989  ............ 29/25.35 X
(Continued)

OTHER PUBLICATIONS

Machine Language Translation of JP 2002-43644.*
(Continued)

*Primary Examiner* — A. Dexter Tugbang
(74) *Attorney, Agent, or Firm* — Baker Botts L.L.P.

(57) ABSTRACT

A method for producing a piezoelectric actuator includes forming a diffusion preventing layer on one surface of a substrate formed of a metallic material for preventing a diffusion of a metal from the substrate, heating a diffusion preventing layer at a first temperature in order to relieve a residual stress in the diffusion preventing layer, forming an electrode on a surface of the diffusion preventing layer, the surface not facing the substrate, forming a piezoelectric layer of a piezoelectric material on a surface of the electrode, the surface not facing the diffusion preventing layer, and annealing the piezoelectric layer at a second temperature. Accordingly, it is possible to prevent the electrode from being exfoliated from the diffusion preventing layer. Moreover, it is possible to prevent a crack being developed in the piezoelectric layer.

10 Claims, 14 Drawing Sheets

(51) Int. Cl.
*H01L 41/29* (2013.01)
*H01L 41/316* (2013.01)
*H01L 41/312* (2013.01)
*H01L 41/37* (2013.01)
*H01L 41/09* (2006.01)
*C01B 33/113* (2006.01)
*C23C 18/12* (2006.01)
*H03H 3/00* (2006.01)
*H03H 3/02* (2006.01)
*H01L 41/319* (2013.01)

(52) U.S. Cl.
CPC ........... *H01L 41/312* (2013.01); *H01L 41/314* (2013.01); *H01L 41/316* (2013.01); *H01L 41/37* (2013.01); *C01B 33/113* (2013.01); *C23C 18/12* (2013.01); *C23C 18/1208* (2013.01); *C23C 18/1216* (2013.01); *H01L 41/319* (2013.01); *H03H 3/00* (2013.01); *H03H 3/02* (2013.01); *Y10T 29/42* (2015.01); *Y10T 29/49155* (2015.01)

(56) References Cited

U.S. PATENT DOCUMENTS

| | | | | |
|---|---|---|---|---|
| 5,786,278 | A | * | 7/1998 | Fry ............................ 438/787 |
| 6,089,701 | A | * | 7/2000 | Hashizume et al. ........... 347/70 |
| 6,849,166 | B2 | | 2/2005 | Kita |
| 7,010,837 | B2 | * | 3/2006 | Takata et al. ............... 29/25.35 |
| 7,115,936 | B2 | | 10/2006 | Kita |
| 2002/0159941 | A1 | * | 10/2002 | Fukuoka et al. ...... 427/255.27 X |
| 2004/0241330 | A1 | * | 12/2004 | Kijima et al. ............. 427/372.2 |
| 2005/0012786 | A1 | * | 1/2005 | Kobayashi ..................... 347/68 |
| 2005/0277223 | A1 | * | 12/2005 | Lee et al. ................... 556/51 X |
| 2006/0051506 | A1 | * | 3/2006 | Senzaki et al. ............. 427/248.1 |
| 2006/0279170 | A1 | | 12/2006 | Yasui |

FOREIGN PATENT DOCUMENTS

| | | | | |
|---|---|---|---|---|
| JP | 04102314 | A | * 4/1992 | ............... 29/25.35 X |
| JP | 2001152361 | A | 6/2001 | |
| JP | 2002043644 | A | 2/2002 | |
| JP | 2002234709 | A | 8/2002 | |
| JP | 2003298027 | A | 1/2003 | |
| JP | 2005168172 | A | 6/2005 | |
| JP | 2005-345143 | A | 12/2005 | |
| JP | 2006049806 | A | 2/2006 | |
| JP | 2006-175600 | A | 7/2006 | |
| JP | 2006-229154 | A | 8/2006 | |
| JP | 2006-261656 | A | 9/2006 | |

OTHER PUBLICATIONS

Japan Patent Office, Notice of Reasons for Rejection in counterpart Patent Application No. JP 2007-083564 mailed Aug. 18, 2009.

* cited by examiner

→ SCANNING DIRECTION

↙ PAPER FEEDING DIRECTION

SCANNING DIRECTION

PAPER FEEDING DIRECTION

---▲--- CHANGE IN INTERNAL STRESS
        AT THE TIME OF HEATING
---■--- CHANGE IN INTERNAL STRESS
        AT THE TIME OF COOLING

METHOD FOR PRODUCING PIEZOELECTRIC ACTUATOR

CROSS-REFERENCE TO RELATED APPLICATION

The present application claims priority from Japanese Patent Application No. 2007-083564, filed on Mar. 28, 2007, the disclosure of which is incorporated herein by reference in its entirety.

BACKGROUND OF THE INVENTION

1. Field of the Invention

The present invention relates to a method for producing a piezoelectric actuator which is used in apparatuses such as a liquid transporting apparatus.

2. Description of the Related Art

In a liquid transporting apparatus, a piezoelectric actuator which applies pressure for transporting a liquid is used. For example, in an ink-jet recording head described in Japanese Patent Application Laid-open No. 2005-168172, for manufacturing a piezoelectric actuator, firstly, a first insulating film (substrate) is formed on an upper surface of a channel forming substrate in which ink channels are formed, and a second insulating film (diffusion preventing layer) is formed by a sputtering method on an upper surface of the first insulating film. Further, a film for forming lower electrode which becomes a lower electrode is formed by the sputtering method on an upper surface of the second insulating film, and a piezoelectric precursor film which becomes a piezoelectric film (piezoelectric layer) is formed by a sol-gel method on the upper surface of the film forming lower electrode. Thereafter, for achieving piezoelectric characteristics, a stacked body including the piezoelectric precursor film is baked to crystallize the piezoelectric film thereby forming the piezoelectric film.

However, when an ink-jet recording head is manufactured by a method described in Japanese Patent Application Laid-open No. 2005-168172, a residual stress is generated in the second insulating film after the second insulating film has been formed. Therefore, when a piezoelectric precursor film is baked, the residual stress of the second insulating film is relieved, and an internal stress of the second insulating film is changed. Moreover, the second insulating film is deformed due to the change in the internal stress. At this time, a lower electrode and a piezoelectric film cannot follow the deformation of the second insulating film, and there is a possibility that the lower electrode is exfoliated from the second insulating layer, and a crack is developed in the piezoelectric film.

SUMMARY OF THE INVENTION

An object of the present invention is to provide a method for producing a piezoelectric actuator which is capable of preventing an electrode from being exfoliated from a diffusion preventing layer, and preventing a crack from being developed in the piezoelectric layer.

According to a first aspect of the present invention, there is provided a method for producing a piezoelectric actuator, including: forming a diffusion preventing layer, on one surface of a substrate formed of a metallic material, for preventing a diffusion of a metal from the substrate; heating the diffusion preventing layer at a first temperature; forming an electrode on a surface of the diffusion preventing layer, the surface not facing the substrate; forming a piezoelectric layer of a piezoelectric material on a surface of the electrode, the surface not facing the diffusion preventing layer; and annealing the piezoelectric layer at a second temperature, wherein the first temperature is lower than the second temperature.

In a case of forming the diffusion preventing layer by making particles of a metallic oxide to be deposited on the surface of the substrate, a residual stress is generated in the diffusion preventing layer. When the electrode and the piezoelectric layer are formed without relieving the residual stress, and the piezoelectric layer is annealed, the diffusion preventing layer is heated together with the piezoelectric layer, and the residual stress in the diffusion preventing layer is relieved due to heating, and an internal stress of the diffusion preventing layer changes. Moreover, due to the change in the internal stress, the diffusion preventing layer is deformed. At this time, the electrode and the piezoelectric layer which are formed on the surface of the diffusion preventing layer cannot follow (cope with) the deformation of the diffusion preventing layer, and the electrode is exfoliated from the diffusion preventing layer, and a crack is developed in the piezoelectric layer.

However, in the present invention, before forming the piezoelectric layer, the residual stress in the diffusion preventing layer has been relieved in advance by heating the diffusion preventing layer, and thereafter, the piezoelectric layer is formed and the piezoelectric layer is annealed. Therefore, the change in the internal stress of the diffusion preventing layer due to the heating at the time of annealing the piezoelectric layer is small. Consequently, the abovementioned exfoliation of the electrode from the diffusion preventing layer, and the cracking of the piezoelectric layer hardly occur.

Moreover, since the substrate is also heated together with the diffusion preventing layer when the diffusion preventing layer is heated, higher the first temperature, an amount of metal atoms diffusing from the substrate to the diffusion preventing layer increases. On the other hand, an amount of metal (metal atoms) which can be prevented from being diffused by the diffusion preventing layer is determined by factors such as a material and a thickness of the diffusion preventing layer. Consequently, when the first temperature is made to be excessively high, although it is possible to relieve the residual stress of the diffusion preventing layer, there is a possibility that due to the annealing of the piezoelectric layer thereafter, the metal atoms which are diffused from the substrate cross through the diffusion preventing layer and reach the piezoelectric layer, and piezoelectric characteristics of the piezoelectric layer are declined. However, by keeping the first temperature to be lower than the second temperature, it is possible to reduce a diffusion amount of the metal atoms which form the substrate, at the time of heating the diffusion preventing layer. Therefore, it is possible to prevent assuredly the metal atoms which form the substrate, from reaching the piezoelectric layer upon crossing through the diffusion preventing layer, during the annealing of the piezoelectric layer thereafter.

In the method for producing the piezoelectric actuator of the present invention, the diffusion preventing layer may be formed by an aerosol deposition method. When the aerosol deposition method (AD method) is used, it is possible to form the diffusion preventing layer easily. However, in a case of forming the diffusion preventing layer by the AD method, particularly, a substantial residual stress is developed. Therefore, if the electrode and the piezoelectric layer are formed and the piezoelectric layer is annealed without relieving the residual stress in the diffusion preventing layer, there is a substantial change in the internal stress of the diffusion preventing layer due to the residual stress in the diffusion preventing layer being relieved, and the electrode is susceptible to be exfoliated from the diffusion preventing layer, and the piezoelectric layer is susceptible to be cracked. However, by heating the diffusion preventing layer in advance, since it is possible to relieve the residual stress of the diffusion preventing layer, it is possible to make the change in the internal stress of the diffusion preventing layer due to the heating during the annealing of the piezoelectric layer sufficiently small.

In the method for producing the piezoelectric actuator of the present invention, the diffusion preventing layer may be formed of a metallic oxide, and may be formed of a material such as alumina or zirconia. Since a metallic oxide, particularly alumina and zirconia, have a dense structure, it is possible to suppress effectively the metals which are diffused from the substrate from crossing through the diffusion preventing layer and reaching the piezoelectric layer. Further, the first temperature may be lower than melting temperature of alumina and melting temperature of zirconia. In general, the melting temperature of alumina is higher than 800° C., and the melting temperature of zirconia is higher than 1500° C.

In the method for producing the piezoelectric actuator of the present invention, a residual stress in the diffusion preventing layer may be relieved by heating the diffusion preventing layer at the first temperature, and the first temperature may be not lower than 500° C. In a case of heating the diffusion preventing layer of alumina which is formed by the AD method, the residual stress is relieved comparatively rapidly in an area of a temperature lower than 500° C., and the residual stress is relieved comparatively slowly in an area of a temperature not lower than 500° C. Consequently, by making the first temperature to be not lower than 500° C., it is possible to relieve sufficiently the residual stress in the diffusion preventing layer. Accordingly, the change in the internal stress of the diffusion preventing layer due to the heating during the annealing of the piezoelectric layer is decreased assuredly.

In the method for producing the piezoelectric actuator of the present invention, after the electrode has been formed and before the piezoelectric layer is formed, a residual stress in the diffusion preventing layer may be relieved by heating the diffusion preventing layer at the first temperature. In this case, since not only the diffusion preventing layer but also the electrode is heated, it is possible to relieve the residual stress of the electrode together with the residual stress in the diffusion preventing layer.

The method for producing the piezoelectric actuator may further include relieving a residual stress in an electrode by heating the electrode at a third temperature after the electrode has been formed and before the piezoelectric layer is formed, and the third temperature may be lower than the second temperature. When the electrode is formed, a residual stress is developed in the electrode. If the piezoelectric layer is formed and annealed without relieving the residual stress of the electrode, the electrode is also heated together with the piezoelectric layer, and the residual stress of the electrode is relieved due to heating, and the internal stress of the electrode changes. Since the electrode is deformed due to the change in the internal stress, the piezoelectric layer cannot follow the deformation of the electrode, and there is a possibility that a crack is developed in the piezoelectric layer. However, according to the present invention, before the piezoelectric layer is formed, the residual stress in the electrode is relieved in advance by heating the electrode at the third temperature, and thereafter, the piezoelectric layer is formed, and the piezoelectric layer is annealed at the second temperature. Therefore, the change in the internal stress of the electrode due to the heating during the annealing of the piezoelectric layer becomes small. Consequently, the abovementioned crack in the piezoelectric layer hardly occurs. Moreover, since the substrate is also heated together with the electrode at the time of heating the electrode, higher the third temperature, the amount of metal atoms diffusing from the substrate to the diffusion preventing layer increases. On the other hand, the amount of metal atoms which can be prevented from being diffused by the diffusion preventing layer is determined by the factors such as the material and the thickness of the diffusion preventing layer. Consequently, if the third temperature is made to be excessively high, it is possible to relieve the residual stress of the electrode, but due to the annealing of the piezoelectric layer thereafter, the metal atoms diffused from the substrate cross through the diffusion preventing layer and reach the piezoelectric layer, and there is a possibility that the piezoelectric characteristics of the piezoelectric layer are declined. However, in the present invention, since the third temperature is made to be lower than the second temperature, it is possible to decrease the diffusion amount of the metal atoms which form the substrate at the time of heating the electrode. Therefore, it is possible to prevent assuredly the metal atoms from crossing through the diffusion preventing layer and reaching the piezoelectric layer, during the annealing of the piezoelectric layer thereafter.

In the method for producing the piezoelectric actuator of the present invention, the third temperature may be lower than the first temperature. A heating temperature which is necessary for relieving sufficiently the residual stress of the electrode is lower than a heating temperature which is necessary for relieving sufficiently the residual stress of the diffusion preventing layer. Therefore, it is possible to make the third temperature to be lower than the first temperature. Further, it is possible to reduce the diffusion amount of the metal atoms forming the substrate, to the diffusion preventing layer, at the time of heating the electrode.

In the method for producing the piezoelectric actuator of the present invention, the piezoelectric layer may be formed by the aerosol deposition method. When the piezoelectric layer is formed by the aerosol deposition method, an annealing process of heating the piezoelectric layer at a high temperature is necessary to let the particles forming the piezoelectric layer grow. However, according to the present invention, the abovementioned exfoliation of the electrode from the diffusion preventing layer, and the cracking of the piezoelectric layer hardly occur at the time of annealing the piezoelectric layer.

BRIEF DESCRIPTION OF THE DRAWINGS

FIG. 10A shows a case of an example for comparison and FIG. 10B shows a case of a first example;

FIG. 11A shows a case of an example for comparison, and FIG. 11B shows a case of the first example;

DETAILED DESCRIPTION OF THE PREFERRED EMBODIMENTS

A preferred embodiment of the present invention will be described below.

Figure 1:
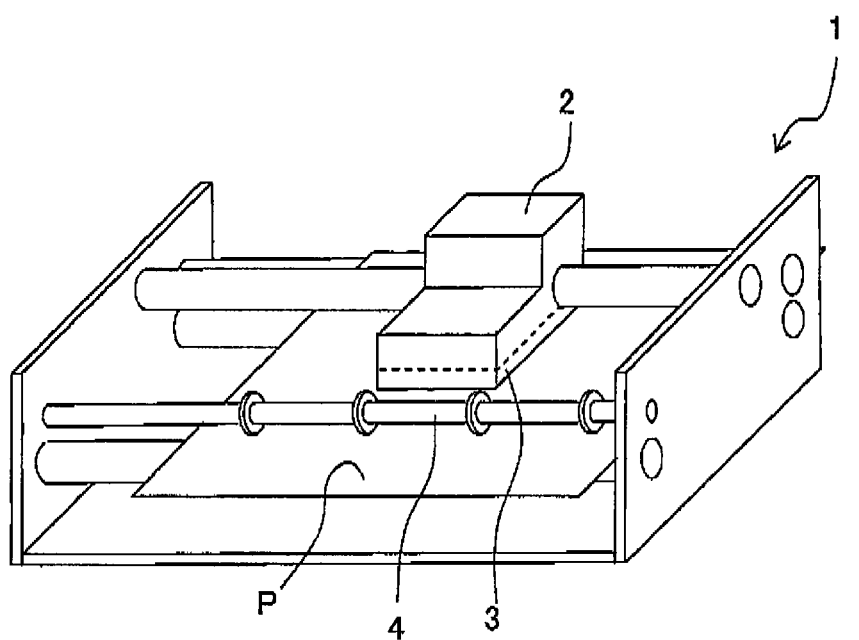
FIG. 1 is a schematic structural diagram of a printer according to an embodiment of the present invention.

FIG. 1 is a schematic structural diagram of a printer according an embodiment of the present invention. As shown in FIG. 1, a printer 1 includes a carriage 2, an ink-jet head 3, and a paper transporting roller 4.

The carriage 2 reciprocates in a left and right direction (scanning direction) in FIG. 1. The ink-jet head 3 is arranged on a lower surface of the carriage 2, and jets an ink from nozzles 15 formed in a lower surface thereof (refer to FIG. 3), while reciprocating in the scanning direction together with the carriage 2. The paper transporting roller 4 transports a recording paper P in a frontward direction (paper feeding direction) in FIG. 1. In the printer 1, printing is carried out on the recording paper P by jetting the ink from the ink-jet head 3, which reciprocates in the scanning direction together with the carriage 2, onto the recording paper P which is transported in the paper feeding direction by the paper transporting roller 4. Moreover, the recording paper P with a printing carried out thereon is discharged by the paper transporting roller 4.

Figure 2:
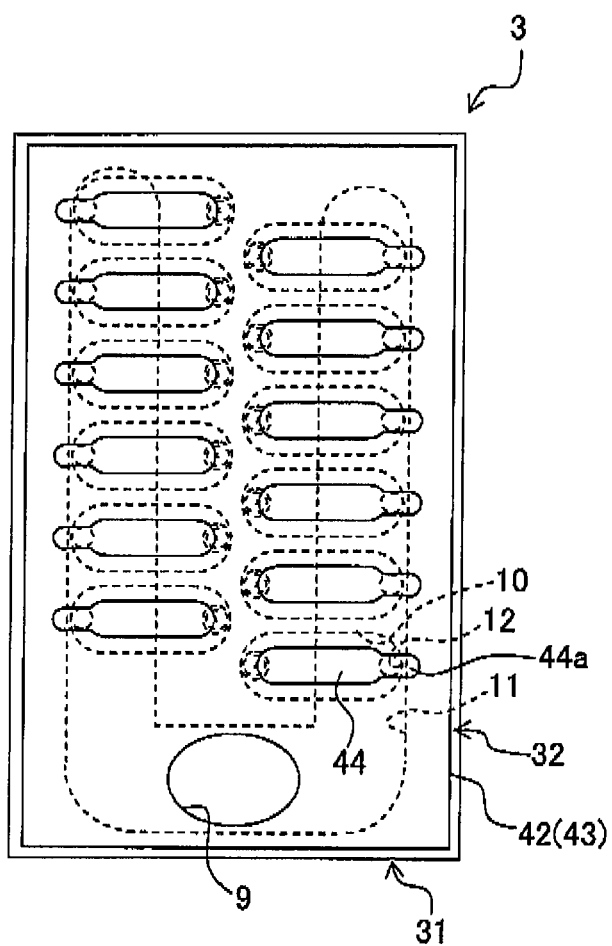
FIG. 2 is a plan view of an ink-jet head in FIG. 1.
Figure 3:
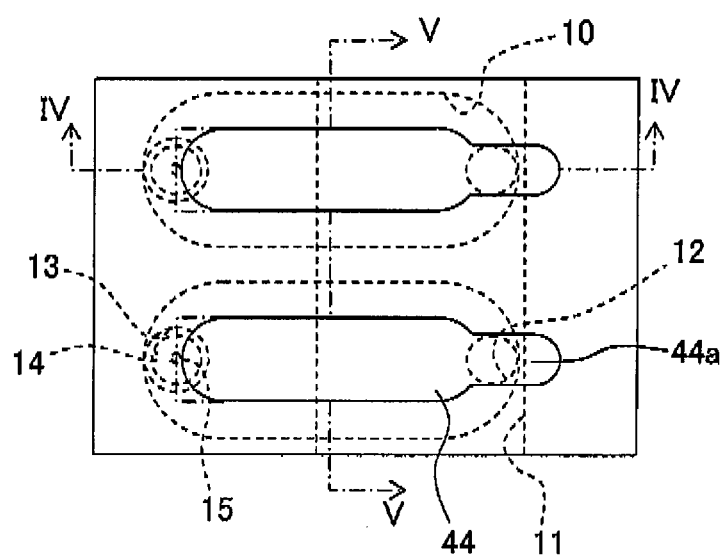
FIG. 3 is a partially enlarged view of FIG. 2.
Figure 4:
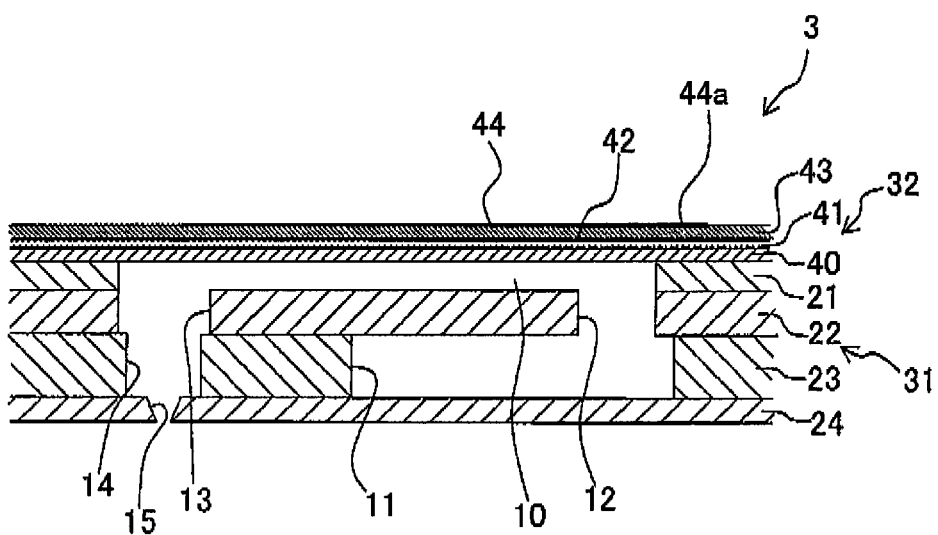
FIG. 4 is a cross-sectional view taken along a line IV-IV in FIG. 3.
Figure 5:
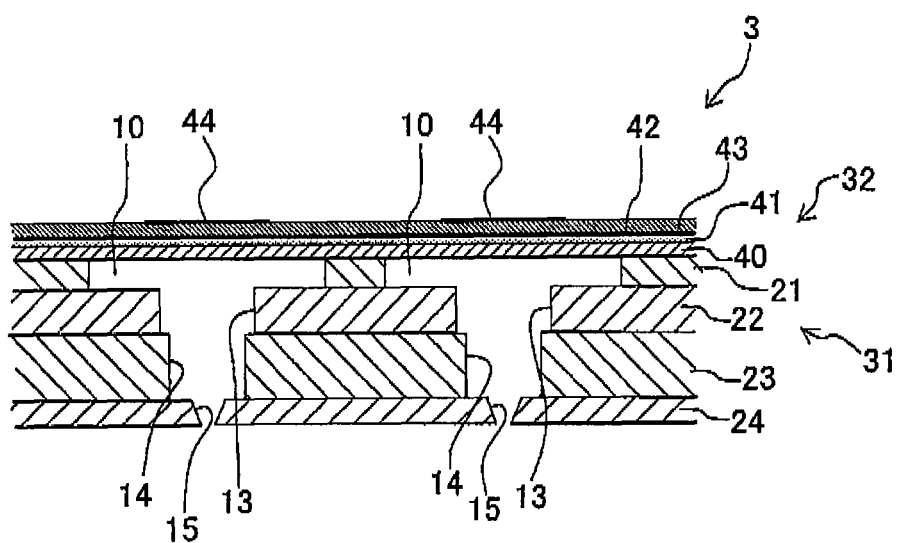
FIG. 5 is a cross-sectional view taken along a line V-V in FIG. 3.

Next, the ink-jet head 3 will be described below. FIG. 2 is a plan view of the ink-jet head 3 in FIG. 1. FIG. 3 is a partially enlarged view of FIG. 2. FIG. 4 is a cross-sectional view taken along a line IV-IV in FIG. 3. FIG. 5 is a cross-sectional view taken along a line V-V in FIG. 3.

As shown in FIG. 2 to FIG. 5, the ink-jet head 3 includes a channel unit 31 in which a plurality of ink channels such as pressure chambers 10 is formed, and a piezoelectric actuator 32 which is arranged on an upper surface of the channel unit 31 and which applies a pressure to the ink in the pressure chamber 10 for jetting the ink from the nozzles 15.

The channel unit 31 includes a cavity plate 21, a base plate 22, a manifold plate 23, and a nozzle plate 24, and these four plates are joined in stacked layers. Among these four plates 21 to 24, the three plates 21 to 23 except for the nozzle plate 24 are formed of a metallic material such as stainless steel, and the nozzle plate 24 is formed of a synthetic resin material such as polyimide. Or, the nozzle plate 24 may also be formed by a metallic material, similar to the other three plates 21 to 23.

The plurality of pressure chambers 10 is formed in the cavity plate 21. The pressure chamber 10 has a substantially elliptical flat shape with a scanning direction (left and right direction in FIG. 2) as a longitudinal direction. The pressure chambers 10 are arranged in two rows in the scanning direction, and each row has five pressure chambers 10 in the paper feeding direction (vertical direction in FIG. 2). Through holes 12 and 13 are formed in the base plate 22, at positions overlapping at both ends in the longitudinal direction of the pressure chamber 10 in a plan view.

Manifold channels 11 which are extended in two rows in the paper feeding direction, and which overlap in a plan view with substantial left-half portion of pressure chambers 10 arranged on a left side in FIG. 2, and with substantial right-half portion of pressure chambers 10 arranged on a right side in FIG. 2 are formed in the manifold plate 23. Ink is supplied to the manifold channel 11 from an ink supply port 9 which is formed in a vibration plate 40 which will be described later. Moreover, a through hole 14 is formed in the manifold plate 23, at a position overlapping with the through hole 13 in a plan view.

The nozzle 15 is formed in the nozzle plate 24, at a position overlapping with the through hole 14 in a plan view. In the channel unit 31, the manifold channel 11 communicates with the pressure chamber 10 via the through hole 12, and the pressure chamber 10 communicates with the nozzle 15 via the through holes 13 and 14. In other words, in the channel unit 31, a plurality of individual ink channels from an outlet of the manifold channel 11 reaching up to the nozzle 15 via the pressure chamber 10 is formed.

The piezoelectric actuator 32 is formed by stacking in order from a lower side, the vibration plate 40 (substrate) a diffusion preventing layer 41, a lower electrode 42, a piezoelectric layer 43, and a plurality of upper electrodes 44.

The vibration plate 40 is formed of a metallic material such as stainless steel, and is joined to an upper surface of the cavity plate 21, covering the pressure chambers 10. The diffusion preventing layer 41 is formed of alumina, and is formed over an entire area of an upper surface of the vibration plate 40. The diffusion preventing layer 41 is a layer for preventing the metallic material forming the vibration plate 40 from being diffused due to beating in an annealing process which will be described later, and from reaching the piezoelectric layer 43.

The lower electrode 42 is made of an electroconductive material such as Ti/Pt material, and is formed on an entire area of an upper surface of the diffusion preventing layer 41. Moreover, the lower electrode 42 is connected to a driver IC which is not shown in the diagram, and is kept all the time at a ground electric potential. The piezoelectric layer 43 is formed of a piezoelectric material. The piezoelectric material is mainly composed of lead zirconium titanate which is a ferroelectric substance and which is a mixed crystal (ternary metallic oxide) of lead titanate and lead zirconate. The piezoelectric layer 43 is formed continuously on the upper surface of the diffusion preventing layer 41 on which the lower electrode 42 is formed, spreading over the pressure chambers 10. The piezoelectric layer 43 is polarized in advance in a direction of thickness thereof.

The upper electrodes 44 are formed of an electroconductive material such as Ti/Pt material similarly as the lower electrode 42, and are formed on the piezoelectric layer 43 corresponding to the pressure chambers 10. Each upper electrode 44 has a substantial elliptical flat shape slightly smaller than the pressure chamber 10, and is arranged at a position overlapping with a substantially central portion of the pressure chamber 10 in a plan view. An end portion on a side opposite to the nozzle 15 with respect to a longitudinal direction of the upper electrode 44 is extended in the longitudinal direction of the upper electrode 44, up to a position not overlapping with the pressure chamber 10, and a front end thereof is a contact point 44a. Wire members such as flexible printed circuits (FPC), which is not shown in the diagram, for connections with the driver IC which applies a driving electric potential to the upper electrode but is not shown in the diagram, are connected to the contact point 44a. The driving electric potential is applied to each upper electrode 44 by the driver IC via the FPC.

Here, a method for driving the piezoelectric actuator 32 will be described below. For driving the piezoelectric actuator 32, the driving electric potential is applied to the upper electrode 44 from the driver IC which is not shown in the diagram. As the driving electric potential is applied to the upper electrode 44, an electric potential difference is generated between the upper electrode 44 to which the driving electric potential is applied, and the lower electrode 42 which is kept at the ground electric potential, and an electric field in a direction of thickness is generated in a portion of the piezoelectric layer 43 sandwiched between the upper electrode 44 and the lower electrode 42. Since a direction of this electric field coincides with a direction in which the piezoelectric layer 43 is polarized, this portion of the piezoelectric layer 43 is contracted in a horizontal direction which is orthogonal to the direction of polarization. Due to the contraction of the piezoelectric layer 43, a portion overlapping with the pressure chamber 10 of the vibration plate 40, the diffusion preventing plate 41, the lower electrode 42, and the piezoelectric layer 43 is deformed to project toward the pressure chamber 10. Accordingly, a volume of the pressure chamber 10 is decreased, and a pressure of the ink inside the pressure chamber is increased. Therefore, the ink is jetted from the nozzle 15 communicating with the pressure chamber 10.

Figure 6:
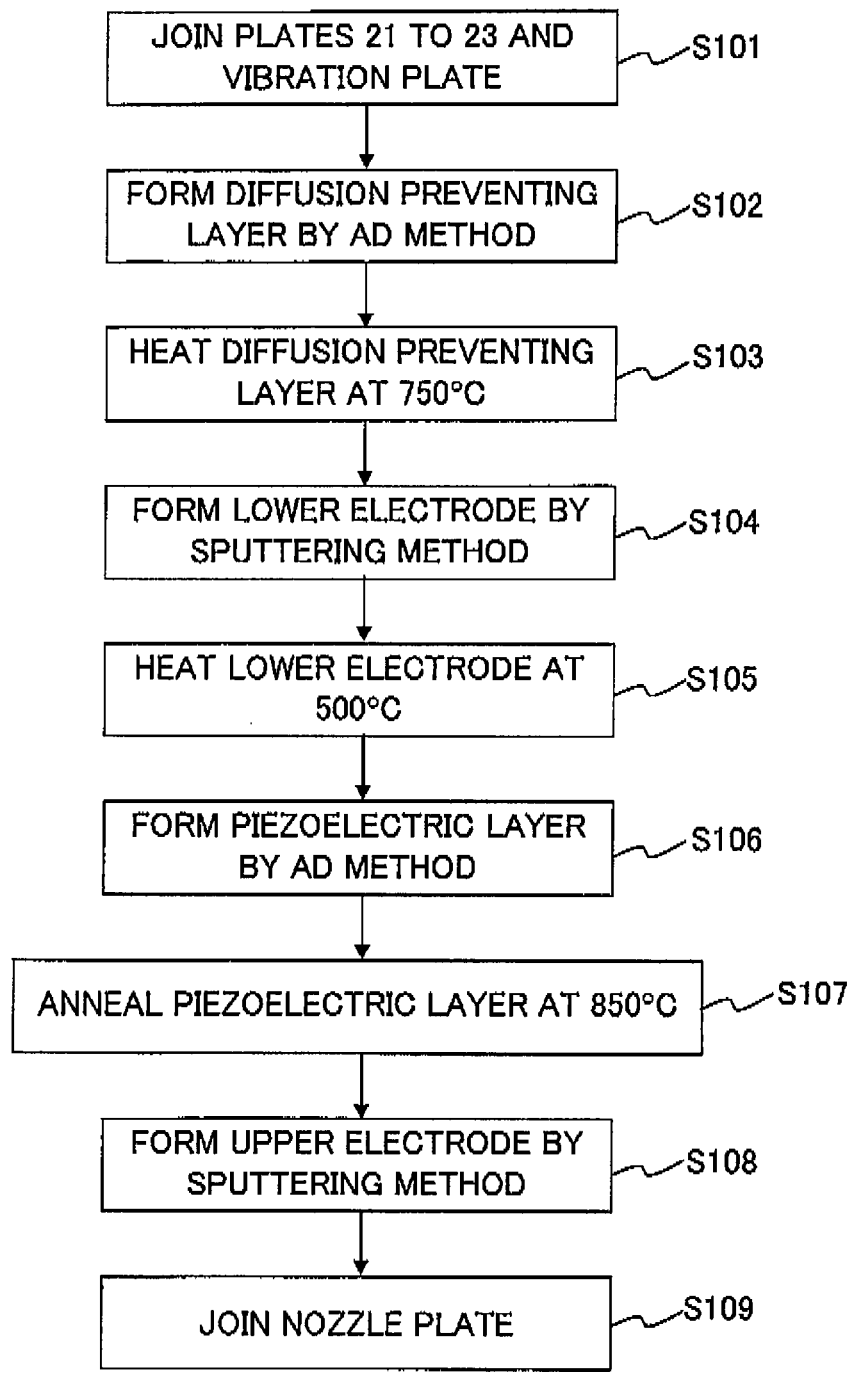
FIG. 6 is a flowchart showing a manufacturing process of the ink-jet head.

Next, a method for producing the ink-jet head 3 will be described below. FIG. 6 is a flowchart showing manufacturing steps of the ink-jet head 3. FIG. 7A to FIG. 7E show a process diagram of a manufacturing process of the piezoelectric actuator 32. In FIG. 7A to FIG. 7E, a portion of the channel unit 31, below the cavity plate 21 is not shown in the diagram.

Figure 7A:
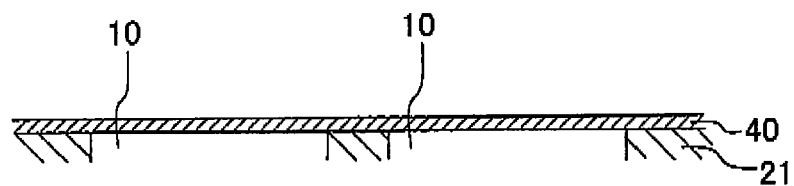
FIGS. 7A to 7E are process diagrams showing a manufacturing process of a piezoelectric actuator.

At the time of manufacturing the ink-jet head 3, as shown in FIG. 6 and FIG. 7A, firstly, the plates 21 to 23 and the vibration plate 40 are stacked mutually, and are joined by metal diffusion (step S101). When the nozzle plate 24 is formed of a metallic material, the nozzle plate 24 may also be joined with the plates 21 to 23, and the vibration plate 40 by the metal diffusion. In this case, it is possible to omit a step of joining (S109) the nozzle plate 24 to the lower surface of the manifold plate 23 by an adhesive etc. which will be described later.

Figure 7B:
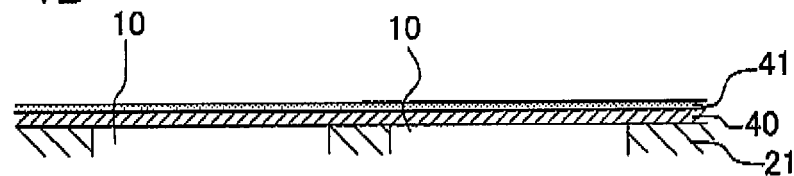

Next, as shown in FIG. 6 and FIG. 7B, by an aerosol deposition method (AD method), alumina is made to be deposited on the upper surface of the vibration plate 40, and the diffusion preventing layer 41 is formed (step S102, diffusion preventing layer forming step).

Figure 8:
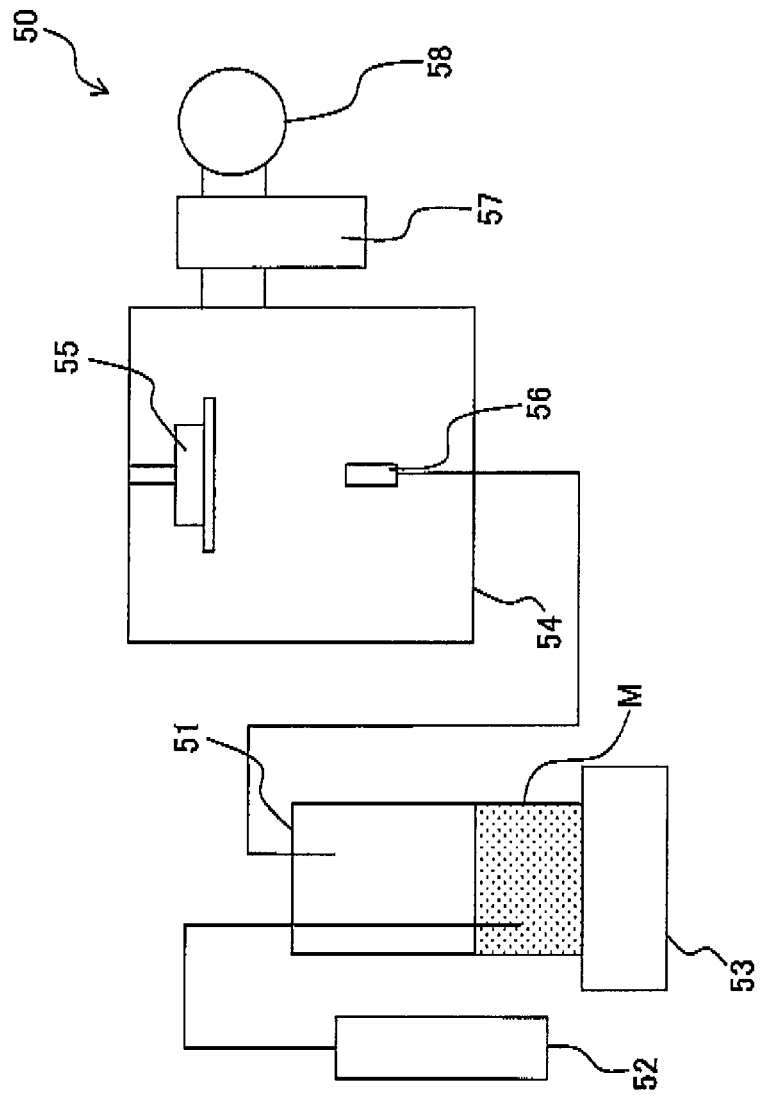
FIG. 8 is a schematic structural diagram of a film forming apparatus which carries out film forming by an AD method (Aerosol Deposition method)

Here, a film forming apparatus for forming the diffusion preventing layer 41 by the AD method will be described below. FIG. 8 is a schematic structural diagram of the film forming apparatus for forming a film by the AD method. As shown in FIG. 8, a film forming apparatus 50 includes an aerosol chamber 51, a gas cylinder 52, an agitator 53, a film forming chamber 54, a particle recovery unit 57, and a vacuum pump 58.

Alumina particles M, which is a material of the diffusion preventing layer 41, are filled in the aerosol chamber 51. The gas cylinder 52 is connected to the aerosol chamber 51, and a carrier gas such as an inert gas like helium, argon, and nitrogen, air, or oxygen is supplied to the aerosol chamber 51 for generating aerosol by mixing with the particles of alumina.

The agitator 53 vibrates the aerosol chamber 51. Accordingly, the carrier gas and the particles of alumina in the aerosol chamber 51 are mixed and aerosol is generated.

The film forming chamber 54 is provided with a stage 55 and a nozzle 56. The stage 55 is provided at an upper portion of the film forming chamber 54, and is structured to be reciprocatable in the left and right direction. A substrate on which the particles of alumina are made to be deposited is fixed on a lower surface of the stage 55, and at the time of forming the diffusion preventing layer 41, a stacked body of the plates 21 to 23 and the vibration plate 40 is fixed such that the upper surface of the vibration plate 40 is facing downward. The nozzle 56 is arranged beneath the stage 55, and is connected to the aerosol chamber 51. The aerosol generated in the aerosol chamber 51 as it will be described later, is jetted toward the substrate mounted on the stage 55, from the nozzle 56.

The vacuum pump 58 is connected to the film forming chamber 54 via the particle recovery unit 57, and it is possible to reduce a pressure inside the film forming chamber 54 by the vacuum pump 58. At this time, the particles remained in the film forming chamber 54 are recovered by the particle recovery unit 57.

At the time of forming the diffusion preventing layer 41 on the upper surface of the vibration plate 40 by the film forming apparatus 50, the stacked body of the plates 21 to 23 and the vibration plate 40 is fixed to the lower surface of the stage 55. The carrier gas is supplied by the gas cylinder 52 to the aerosol chamber 51 which is filled with the alumina particles M, and by making the aerosol chamber 51 vibrate by the agitator 53, the alumina particles M and the carrier gas are mixed, and the aerosol is generated. Moreover, the stage 55 is made to reciprocate in the left and right direction, and by reducing the pressure inside the film forming chamber 54 by the vacuum pump 58, the aerosol is jetted toward the reciprocating stage 55 from the nozzle 56. Accordingly, the particles of alumina in the aerosol collide at a high speed with the upper surface of the vibration plate 40, and are deposited on the upper surface of the vibration plate 40, thereby forming the diffusion preventing layer 41. The diffusion preventing layer 41 formed of alumina has a high stiffness.

Next, as shown in FIG. 6, a stacked body of the plates 21 to 23, the vibration plate 40, and the diffusion preventing plate 41 is heated at 750° C. (first temperature) (step S103, first heating step). More elaborately, in a muffle furnace at an ambient atmosphere, the temperature is raised from a normal temperature up to 750° C. in 180 minutes, and thereafter, is kept at 750° C. for 30 minutes. At the time of forming the diffusion preventing layer 41 by the AD method, as it has been described above, since the particles of alumina are made to collide at a high speed on the upper surface of the vibration plate 40, a substantial residual stress is developed in the diffusion preventing layer 41. However, the residual stress of the diffusion preventing layer 41 is relieved by this heating. In general, melting temperature of alumina is higher than 800° C. Since the heating temperature of the stacked body of the plates 21 to 23, the vibration plate 40, and the diffusion preventing plate 41 is lower than the melting temperature of alumina, alumina does not melt during the heating of the stacked body.

Figure 7C:
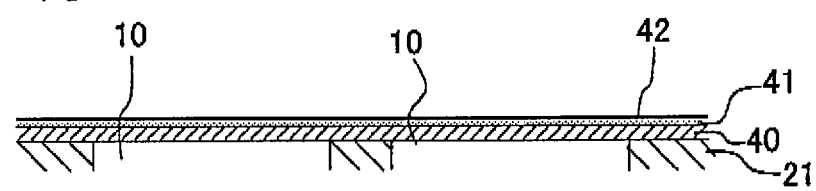

Next, as shown in FIG. 6 and FIG. 7C, the lower electrode 42 is formed on the upper surface (surface on the opposite side of the vibration plate 40) of the diffusion preventing layer 41 by a sputtering method (step S104, electrode forming step). Further, a stacked body of the plates 21 to 23, the vibration plate 40, the diffusion preventing plate 41, and the lower electrode 42 is heated at 500° C. (third temperature) (step S105, third heating step). More elaborately, in the muffle furnace at the ambient atmosphere, the temperature is raised from the normal temperature to 500° C. in 180 minutes, and thereafter, is kept at 500° C. for 30 minutes. Although the residual stress is developed in the lower electrode 42 which is formed, the residual stress is relieved by this heating.

Figure 7D:
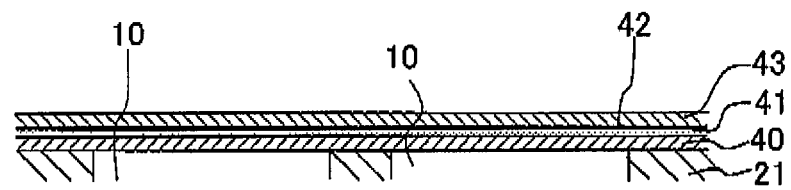

Next, as shown in FIG. 6 and FIG. 7D, the piezoelectric layer 43 is formed by the AD method on the upper surface of the diffusion preventing layer 41 on which the lower electrode 42 is formed (step S106, piezoelectric layer forming step). For forming the piezoelectric layer 43 by the AD method, in the film forming apparatus 50 which has been described above, particles of a piezoelectric material are filled in the aerosol chamber 51, and the stacked body of the plates 21 to 23, the vibration plate 40, the diffusion preventing layer 41, and the lower electrode 42 is fixed to the lower surface of the stage 55 such that the diffusion preventing layer 41 is on a lower side. Further, similarly as the diffusion preventing layer 41 was formed, the particles of the piezoelectric material are made to be deposited on the upper surface of the diffusion preventing layer 41 on which the lower electrode 42 was formed.

Next, an annealing process in which, a stacked body of the plates 21 to 23, the vibration plate, 40, the diffusion preventing layer 41, the lower electrode 42, and the piezoelectric layer 43 is heated at about 850° C. (second temperature) is carried out (step S107, second heating step). In a case of forming the piezoelectric layer 43 by the AD method, since the particles of the piezoelectric material become fine (minute) and a lattice defect is developed when the piezoelectric material collides on the surface of the diffusion preventing layer 41, in this state as it is, sufficient piezoelectric characteristics are not achieved. However, by carrying out such annealing process, crystals of the piezoelectric material grow, and sufficient piezoelectric characteristics are achieved in the piezoelectric layer 43.

At this time, since the diffusion preventing layer 41 is formed between the piezoelectric layer 43 and the vibration plate 40, metal atoms which are diffused from the vibration plate 40 which is heated together with the piezoelectric layer 43 are stopped at the diffusion preventing layer 41, and the metal atoms are suppressed from reaching the piezoelectric layer 43. Accordingly, the metal atoms end up reaching the piezoelectric layer 43 from the vibration plate 40, and the piezoelectric characteristics of the piezoelectric layer 43 are prevented from being declined. Moreover, since the diffusion preventing layer 41 is formed of alumina which has a dense structure, it is possible to suppress effectively the metal atoms diffused from the vibration plate 40 from crossing the diffusion preventing layer 41, and reaching the piezoelectric layer 43.

Moreover, as it has been described above, since the diffusion preventing layer 41 and the lower electrode 42 are heated before the annealing process, and the residual stress in the diffusion preventing layer 41 and the lower electrode 42 is relieved in advance, a change in an internal stress of the diffusion preventing layer 41 and the lower electrode 42 due to the annealing process as it will be described later, becomes small. Consequently, the lower electrode 42 is hardly exfoliated from the diffusion preventing layer 41, and a crack is hardly developed in the piezoelectric layer 43 at the time of heating in the annealing process as it will be described later.

Figure 7E:
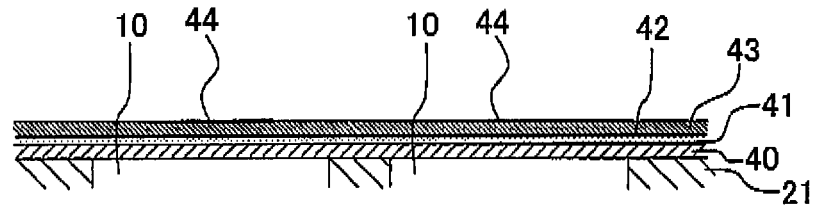

Next, as it is shown in FIG. 6 and FIG. 7E, the upper electrodes 44 are formed by the sputtering method on the upper surface of the piezoelectric layer 43 (step S108). Further, the nozzle plate 24 is joined to a lower surface of the manifold plate 23 by an adhesive (step S109). The ink-jet head 3 is manufactured as described above.

Figure 9A:
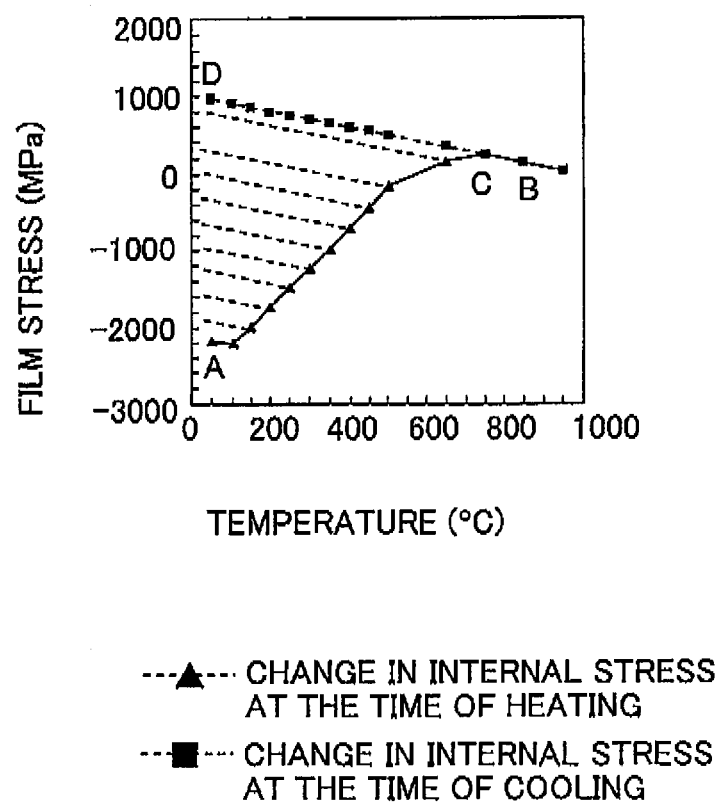
FIG. 9A is a diagram showing a relationship of a temperature of a diffusion preventing layer, a residual stress, and a thermal stress

Next, the change in the internal stress (sum of residual stress and thermal stress) of the diffusion preventing layer, formed on the substrate by the AD method, due to the change in the temperature has been measured. First, the diffusion preventing layer, which is formed of alumina and has thickness about 2 µm, has been formed on the substrate formed of stainless steel using the film forming apparatus described in FIG. 8. After that, while heating and cooling the diffusion preventing layer, the change in the internal stress of the diffusion preventing layer has been measured by using stress measurement system "FLX-2320" produced by Toho Technology Corporation. The measurement results are shown in FIG. 9A. In FIG. 9A, a continuous line shows a relationship between the heating temperature when the diffusion preventing layer 41 is heated and the internal stress of the diffusion preventing layer 41, and a dotted line shows a relationship between the temperature and the internal stress of the diffusion preventing layer 41 when the diffusion preventing layer 41 is cooled down after heating up to each temperature. In FIG. 9A, a tensile stress is indicated by a positive value and a compressive stress is indicated by a negative value.

As shown in FIG. 9A, when the diffusion preventive layer 41 is formed, the compressive stress of approximately 2200 MPa is generated at the normal temperature in the diffusion preventing layer 41, as shown by point A in FIG. 9A. Here, after the diffusion preventing layer 41 is formed, the lower electrode 42 and the piezoelectric layer 43 are formed and the annealing process is carried out at 850° C. without heating the diffusion preventing layer 41. As a result, the residual stress in the diffusion preventing layer 41 is relieved due to heating at this time, and the tensile stress of approximately 130 MPa is generated in the diffusion preventing layer 41 after the annealing process, as shown by point B in FIG. 9A. At this time, the diffusion preventing layer 41 is deformed due to the change in the internal stress, but since an amount of change in the internal stress of the diffusion preventing layer 41 is substantial (changes by approximately 2330 MPa from the compressive stress of approximately 2200 MPa to the tensile stress of approximately 130 MPa), the diffusion preventing layer 41 also substantially deforms. Accordingly, the lower electrode 42 and the piezoelectric layer 43 cannot follow (cope with) the deformation of the diffusion preventing layer 41, and there is a possibility that the lower electrode 42 is exfoliated from the diffusion preventing layer 41, and that a crack is developed in the piezoelectric layer 43.

However, in the embodiment, since the diffusion preventing layer 41 is heated in advance to about 750° C. after the diffusion preventing layer 41 has been formed, the residual stress in the diffusion preventing layer 41 is relieved with the lower electrode 42 and the piezoelectric layer 43 not formed. At this time, the tensile stress of approximately 235 MPa is developed in the diffusion preventing layer 41, as shown by point C in FIG. 9A. Thereafter, when the diffusion preventing layer 41 is cooled down to the normal temperature, the tensile stress of approximately 1000 MPa is developed in the diffusion preventing layer 41 due to the change of the thermal stress, as shown by point D in FIG. 9A. Consequently, the change in the internal stress of the diffusion preventing layer 41 when the lower electrode 42 and the piezoelectric layer 43 are formed and the piezoelectric layer 43 is heated at 850° C. by the annealing process is about 870 MPa (changes from the tensile stress of approximately 1000 MPs at point D to the tensile stress of approximately 130 MPs at point B), which is smaller as compared to the change about 2330 MPa in the internal stress in a case in which the diffusion preventing layer 41 was not heated. Therefore, an amount of deformation of the diffusion preventing layer 41 also becomes small. Consequently, as compared to a case in which the diffusion preventing layer 41 is not heated, the exfoliation of the lower electrode 42 from the diffusion preventing layer 41, and the cracking of the piezoelectric layer 43 hardly occur in the following processes.

Here, when the heating temperature, after the diffusion preventing layer 41 is formed is raised even higher, for example 850° C., which is same as the heating temperature for the annealing process, or higher, as it is revealed from FIG. 9A, in an area of not lower than 750° C., since the internal stress of the diffusion preventing layer 41 does not change substantially, the change in the internal stress of the diffusion preventing layer 41 due to the heating in the annealing process is small similarly as it has been described above. Consequently, even when the diffusion preventing layer 41 is heated at such temperature, the exfoliation of the lower electrode 42 and the cracking of the piezoelectric layer 43 hardly occur at the time of heating in the annealing process.

However, as the heating temperature of the diffusion preventing layer 41 becomes higher, the diffusion of the metal atoms from the vibration plate 40 which is heated together with the diffusion preventing layer 41 is susceptible to advance, and an amount of metal atoms of the vibration plate 40 diffused to the diffusion preventing layer 41 increases. On the other hand, the amount of metal atoms which can be prevented from reaching the piezoelectric layer 43 due to the diffusion preventing layer 41 is determined by factors such as a material and a thickness thereof. Consequently, when the heating temperature of the diffusion preventing layer 41 is raised excessively, there is a possibility that the metal atoms diffused from the vibration plate 40 to the diffusion preventing layer 41 due to the heating of the diffusion preventing layer 41 cross through the diffusion preventing layer 41, and end up reaching the piezoelectric layer 43. Moreover, when the metal atoms end up reaching up to the piezoelectric layer 43, the piezoelectric characteristics of the piezoelectric layer 43 is declined.

For preventing the metal atoms diffused from the vibration plate 40 from reaching the piezoelectric layer 43, increasing a thickness of the diffusion preventing layer 41 may be taken into consideration. In this case, in proportion to an increase in the thickness of the diffusion preventing layer 41, when the piezoelectric actuator 32 is driven, the diffusion preventing layer 41 is hardly deformed, and a drive efficiency of the piezoelectric actuator 32 is declined.

Therefore, it is preferable that the heating temperature of the diffusion preventing layer 41 is lower than 850° C. which is the heating temperature in the annealing process. Moreover, as it is revealed in FIG. 9A, in a case of heating the diffusion preventing layer 41 from the normal temperature up to 850° C., in an area of lower than 500° C., the residual stress of the diffusion preventing layer 41 is relieved comparatively rapidly, whereas, in an area of temperature of not lower than 500° C., the residual stress of the diffusion preventing layer 41 is relieved comparatively slowly. In other words, by making the heating temperature of the diffusion preventing layer 41 to be not lower than 500° C., it is possible to relieve sufficiently the residual stress in the diffusion preventing layer 41. Accordingly, it is possible to make the change in the internal stress of the diffusion preventing layer 41 due to the heating in the annealing process thereafter sufficiently small. Therefore, for making the change in the internal stress of the diffusion preventing layer 41 due to the heating in the annealing process small, it is preferable to make the heating temperature of the diffusion preventing layer 41 to be not lower than 500° C.

Furthermore, as it is revealed from FIG. 9A, the internal stress of the diffusion preventing layer 41 when heated to 750° C. or higher than 750° C. changes along a straight line passing through point D and point B in FIG. 9A. Therefore, it can be said that at a point of time where the diffusion preventing layer 41 is heated up to 750° C., the residual stress thereof is almost relieved completely, and the change in the internal stress of the diffusion preventing layer 41 when heated to a temperature higher than 750° C. is only the change in the thermal stress. Consequently, even when the heating temperature of the diffusion preventing layer 41 is raised higher than 750° C., the change in the internal stress due to the heating in the annealing process thereafter is almost the same as in the case in which the heating temperature of the diffusion preventing layer 41 is made to be 750° C. (temperature changes from point D to point B in FIG. 9A). Accordingly, in the embodiment, the heating temperature of the diffusion preventing layer 41 is set to be 750° C.

Moreover, after forming the lower electrode 42, when the piezoelectric layer 43 is formed without heating the lower electrode 42, and the annealing process is carried out thereafter, the residual stress of the lower electrode 42 due to the heating in the annealing process is relieved, and the internal stress of the lower electrode 42 changes. At this time, when the lower electrode is deformed, even in this case, the piezoelectric layer 43 cannot follow the deformation of the lower electrode 42, and there is a possibility that a crack is developed in the piezoelectric layer 43.

However, in the embodiment, after forming the lower electrode 42, by heating the lower electrode 42, the residual stress of the lower electrode 42 is relieved in advance, and thereafter the piezoelectric layer 43 is formed and the annealing process is carried out. Therefore, the change in the internal stress of the lower electrode 42 due to the heating in the annealing process is small, and the amount of deformation of the lower electrode 42 at this time is small. Consequently, a crack is hardly developed in the piezoelectric layer 43 at the time of heating in the annealing process.

Figure 9B:
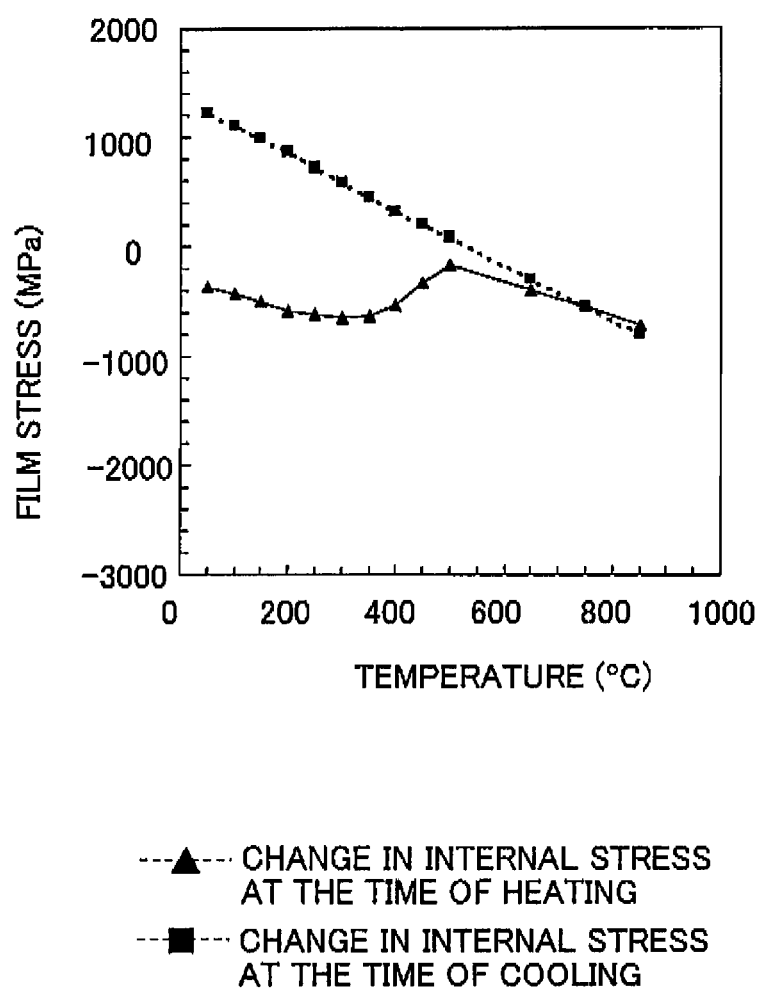
FIG. 9B is a diagram showing a relationship of a temperature of a Pt film, a residual stress and a thermal stress.

Here, for reducing an amount of the metal atoms of the vibration plate 40 diffused to the diffusion preventing layer 41 from the vibration plate 40 due to heating of the lower electrode 42, it is preferable that also the heating temperature of the lower electrode 42 is lower than the heating temperature in the annealing process. In other words, it is preferable that the third temperature is lower than the second temperature. Moreover, since the lower electrode 42 is formed of Ti/Pt material, it is possible to relieve sufficiently the residual stress at a temperature lower than the temperature of the diffusion preventing layer 41 which is formed of alumina. Consequently, it is preferable that the heating temperature of the lower electrode 42 is lower than the heating temperature of the diffusion preventing layer 41. In other words, it is preferable that the third temperature is lower than the first temperature. In the embodiment, since the heating temperature of the diffusion preventing layer 41 is set to be 750° C., it is preferable that the heating temperature of the lower electrode 42 is lower than 750° C. Next, the change in the internal stress of a Pt film, formed on the substrate, due to the change in the temperature has been measured. First, the Pt film, which has thickness about 0.5 μm, has been formed on a Si wafer substrate by the sputtering method using sputtering equipment "L-430-FHL" produced by ANELVA. After that, while heating and cooling the Pt film, the change in the internal stress of the Pt film has been measured by using the stress measurement system "FLX-2320" produced by Toho Technology Corporation. The measurement results are shown in FIG. 9B. In FIG. 9B, a continuous line shows a relationship between the heating temperature when the Pt film is heated and the internal stress of the Pt film, and a dotted line shows a relationship between the temperature and the internal stress of the Pt film when the Pt film is cooled down after heating up to 850° C. In FIG. 91, a tensile stress is indicated by a positive value and a compressive stress is indicated by a negative value. As it is revealed from FIG. 9B, when the heating temperature of the Pt film is raised from 50° C. up to 300° C., the compressive stress of the Pt film is linearly increased. Namely, the compressive stress of the Pt film is raised due to the thermal stress caused by difference in linear coefficient of expansion between the Si wafer substrate and the Pt film. However, when the heating temperature is further raised from 300° C. up to 500° C., as the residual stress of the Pt film is rapidly relieved, the compressive stress of the Pt film is relieved. The internal stress of the Pt film is almost relieved at about 500° C. After that, when the heating temperature is raised higher than 500° C., since the residual stress is almost relieved, the compressive stress of the Pt film is increased again only due to the increase of the thermal stress. Based on these measurement results, in the embodiment, the heating temperature of the lower electrode 42 is set to be 500° C. at which the internal stress of the Pt film is almost relieved. In the embodiment, after the diffusion preventing layer 41 has been heated at the first temperature, the lower electrode 42 is formed, and the lower electrode 42 is heated at the third temperature. However, instead of heating the diffusion preventing layer 41 at the first temperature before forming the lower electrode 42, the diffusion preventing layer 41 may be heated at the first temperature together with the lower electrode 42 after the lower electrode 42 has been formed. By heating the diffusion preventing layer 41 at the first temperature after the lower electrode 42 has been formed, since it is possible to relieve not only the residual stress of the lower electrode 42, but also the residual stress of the diffusion preventing layer 41, it is possible to achieve an effect similar as in the embodiment.

Figure 10A:
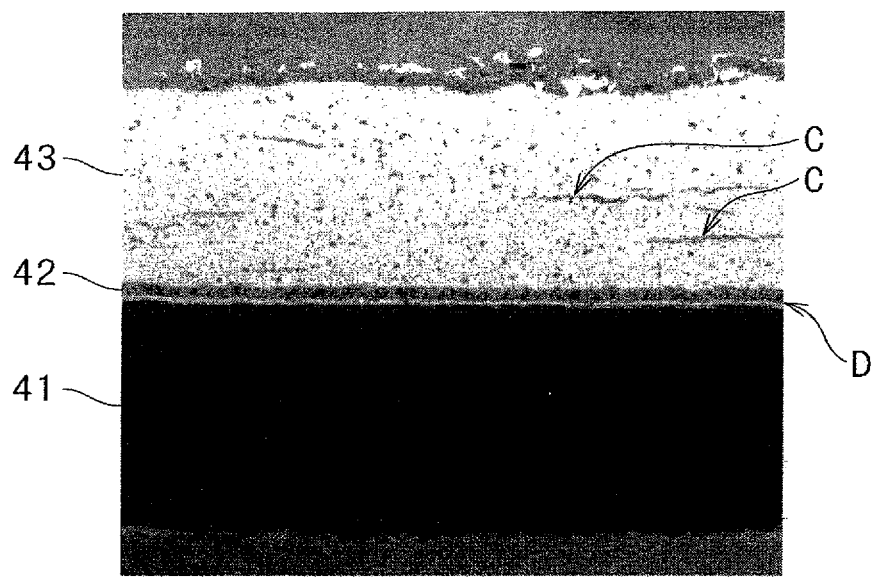
FIG. 10A and FIG. 10B are pictures of a cross-section of a piezoelectric actuator which is manufactured actually, where.
Figure 10B:
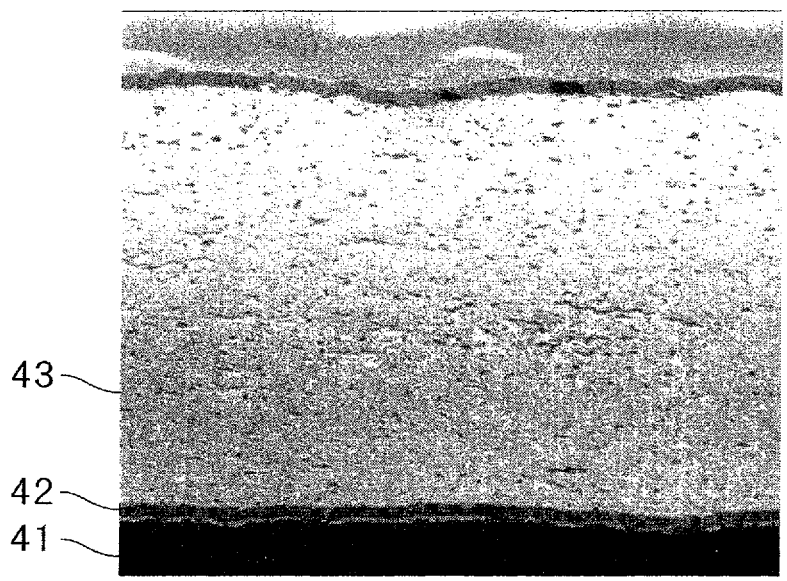
Figure 11A:
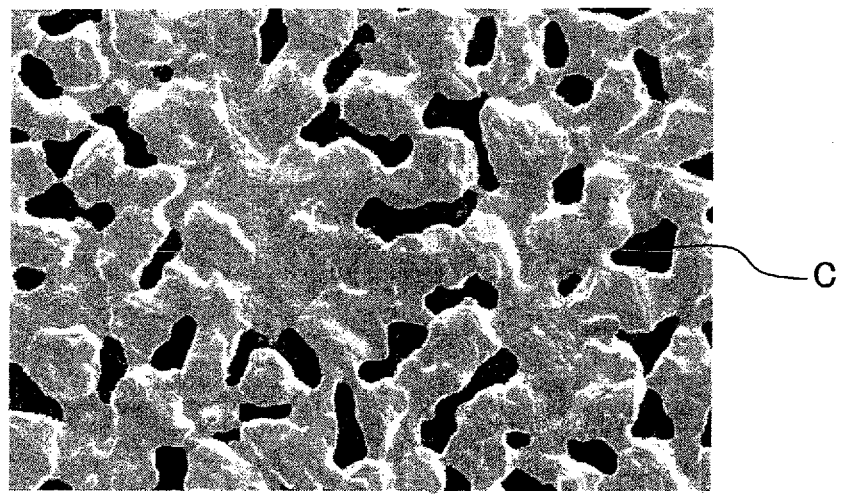
FIG. 11A and FIG. 11B are pictures of a surface of the diffusion preventing layer in the piezoelectric actuator which is manufactured actually, where.
Figure 11B:
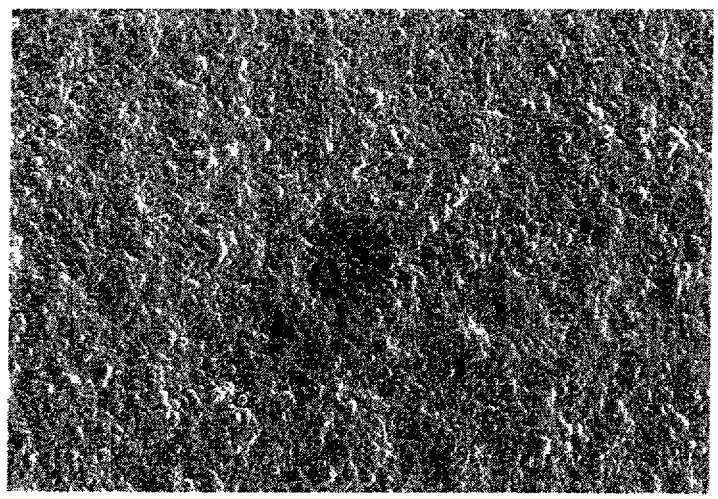

Next, an example for a comparison between a case in which, the piezoelectric actuator 32 is produced by the method in the embodiment described above (first example), and a case in which, the piezoelectric actuator 32 is produced by forming the piezoelectric layer 43 without heating the diffusion preventing layer 41 and the lower electrode 42 (example for comparison) is given below. In the example for comparison, the producing process after the piezoelectric layer 43 is formed is similar to (the producing process) in the first example. FIG. 10A and FIG. 10B are pictures of a cross-section of the piezoelectric actuator 32 which is produced actually, where, FIG. 10A shows a case of the example for comparison and FIG. 10B shows a case of the first example. FIG. 11A and FIG. 11B are pictures of the upper surface of the diffusion preventing layer 41 on which the lower electrode 42 is formed in the piezoelectric actuator 32 which is produced actually, where, FIG. 11A shows a case of the example for comparison, and FIG. 11B shows a case of the first example.

In the case of the example for comparison, as shown in FIG. 10A and FIG. 11A, there occurs an exfoliation D from the diffusion preventing layer 41 in the lower electrode 42 and a crack C is developed in the piezoelectric layer 43. Whereas, in the case of the first example, as shown in FIG. 10B and FIG. 11B, such exfoliation D and the crack C do not occur.

Figure 12:
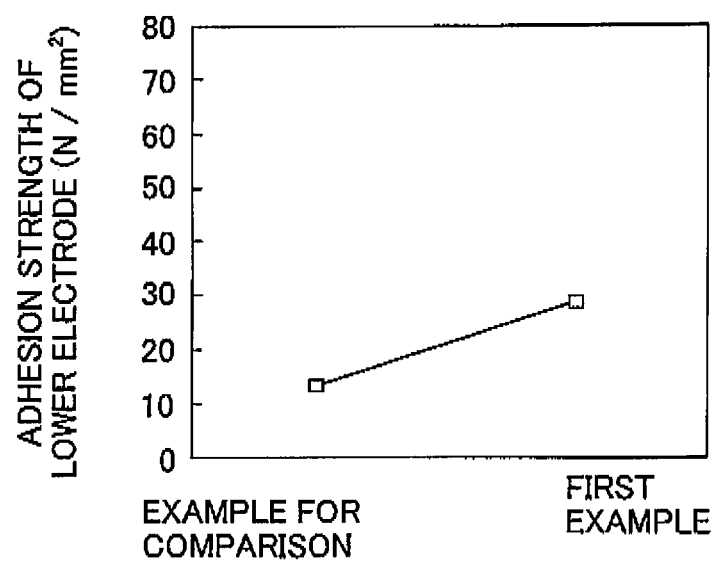
FIG. 12 is a diagram showing an adhesion strength of the diffusion preventing layer and a lower electrode in the piezoelectric actuator which is manufactured actually.

FIG. 12 is a diagram showing an adhesion strength between the diffusion preventing layer 41 and the lower electrode 42 in the first example and the example for comparison. The adhesion strength shown in FIG. 12 is a value measured by a Sebastian method, in which the lower electrode 42 is pulled in a direction of peeling off from the diffusion preventing layer 41, and a tensility when the lower electrode 42 is exfoliated from the diffusion preventing layer 41 is measured as the adhesion strength between the diffusion preventing layer 41 and the lower electrode 42.

As shown in FIG. 12, in the case of the example for comparison, the adhesion strength is about 14 N/mm², where, in the case of the first example the adhesion strength is approximately 28.5 N/mm2, and in the case of the first example the adhesion strength between the diffusion preventing layer 41 and the lower electrode 42 is higher than the adhesion strength of the example for comparison. From this result, it is revealed that in the first example, the lower electrode 42 is hardly exfoliated from the diffusion preventing layer 41.

Figure 13:
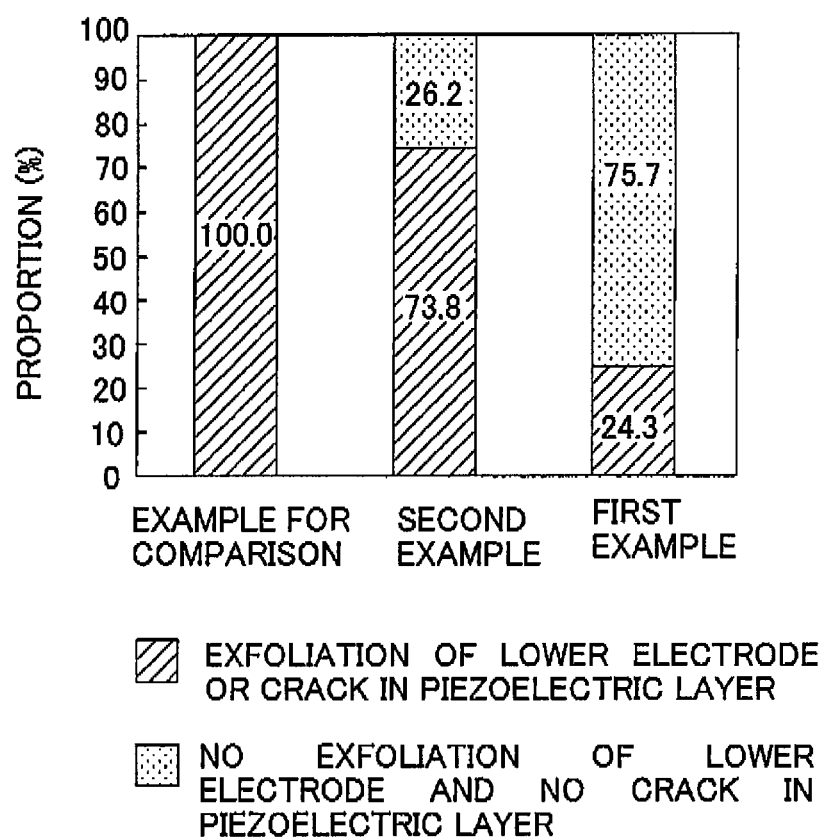
FIG. 13 is a diagram showing a rate of occurrence of a defect for the piezoelectric actuator which is manufactured actually.

FIG. 13 is a diagram showing a rate of occurrence of a defect for the piezoelectric actuator 32 which is produced, in the case of the abovementioned example for comparison, a case in which the piezoelectric actuator 32 is produced by a method in which, the diffusion preventing layer 41 is heated but the lower electrode 42 is not heated and the piezoelectric layer 43 is stacked (second example), and the case in the abovementioned first example. Even in the second example, the producing process after the piezoelectric layer 43 is formed, is same as in the first example. Moreover, the number of samples in the first example, the second example, and the third example is 37, 42, and 8 respectively.

As shown in FIG. 13, in the case of the example for comparison, in the produced piezoelectric actuator 32, the exfoliation of the lower electrode 42 from the diffusion preventing layer 41 and the crack in piezoelectric layer 43 occur almost assuredly (100.0%)

Whereas, in the case of the second example, in the produced piezoelectric actuator 32, a proportion (rate) of occurrence of one of the exfoliation of the lower electrode 42 from the diffusion preventing layer 41 and the crack in the piezoelectric layer 43 is decreased (73.8%). Furthermore, in the case of the first example, in the produced piezoelectric actuator 32, the proportion of occurrence of one of the exfoliation of the lower electrode 42 from the diffusion preventing layer 41 and the crack in the piezoelectric layer 43 is substantially decreased (24.3%).

From this result, it is revealed that by relieving the residual stress in advance by heating the diffusion preventing layer 41 before the annealing process, the exfoliation of the lower electrode 42 from the diffusion preventing layer 41 and the cracking of the piezoelectric layer 43 at the time of heating in the annealing process hardly occur. Further, it is revealed that by relieving the residual stress in advance by heating the lower electrode 42 before the annealing process, the crack hardly occurs in the piezoelectric layer 43 at the time of heating in the annealing process.

In the embodiment described above, if the piezoelectric layer 43 is formed by the AD method, after forming the piezoelectric layer 43, for achieving desired piezoelectric characteristics by allowing to grow the particles of the piezoelectric material forming the piezoelectric layer 43, the annealing process of heating at the temperature of 850° C. is carried out. However, since the residual stress of the diffusion preventing layer 41 is relieved in advance by heating the diffusion preventing layer 41 before forming the lower electrode 42 and the piezoelectric layer 43, the change in the internal stress of the diffusion preventing layer 41 due to the heating in the annealing process thereafter is small. Consequently, at the time of heating in the annealing process, the exfoliation of the lower electrode 42 from the diffusion preventing layer 41, and the cracking of the piezoelectric layer 43 hardly occur.

Moreover, by making the temperature of heating the diffusion preventing layer 41 to be lower than the heating temperature in the annealing process, it is possible to decrease the amount of diffusion of the metal atoms from the vibration plate 40 which is heated simultaneously when the diffusion preventing layer 41 is heated. Accordingly, it is possible to prevent assuredly the metal atoms diffused from the vibration plate 40 at the time of heating in the annealing process thereafter, from crossing through the diffusion preventing layer 41 and reaching the piezoelectric layer 43.

Further, since the diffusion preventing layer 41 is formed of alumina which has a dense structure, it is possible to suppress effectively the metal (atoms) diffused from the vibration plate 40 from crossing through the diffusion preventing layer 41, and reaching the piezoelectric layer 43.

Moreover, when the AD method is used, it is possible to form the diffusion preventing layer 41 easily. When the diffusion preventing layer 41 is formed by the AD method, a particularly substantial residual stress is generated in the diffusion preventing layer 41. However, even in such case, by heating the diffusion preventing layer 41 after forming the diffusion preventing layer 41, it is possible to relieve sufficiently the residual stress of the diffusion preventing layer 41 before the annealing process.

Furthermore, since the residual stress is relieved comparatively slowly in the area in which the heating temperature is 500° C. or higher than 500° C. when the diffusion preventing layer 41 of alumina formed by the AD method is heated, by setting the heating temperature of the diffusion preventing layer 41 to be 750° C. which is higher than 500° C., it is possible to relieve sufficiently the residual stress of the diffusion preventing layer 41, and to make small assuredly the change in the internal stress of the diffusion preventing layer 41 due to the heating in the annealing process.

Moreover, since the residual stress of the lower electrode 42 is relieved in advance by heating the lower electrode 42 after the lower electrode 42 has been formed and before the piezoelectric layer is formed, the change in the internal stress of the lower electrode 42 due to the heating in the annealing process is small. Consequently, a crack is hardly developed in the piezoelectric electric layer 43 at the time of heating during the annealing process.

At this time, by lowering the heating temperature of the lower electrode 42 below the heating temperature in the annealing process, it is possible to decrease the amount of diffusion of the metal atoms from the vibration plate 40 which is heated together with the lower electrode 42. Consequently, it is possible to prevent assuredly the metal atoms forming the vibration plate 40 from crossing through the diffusion preventing layer 41, and reaching the piezoelectric layer 43.

Furthermore, since the heating temperature which is necessary for relieving sufficiently the residual stress of the lower electrode 42 is lower than the heating temperature which is necessary for relieving sufficiently the residual stress of the diffusion preventing layer 41, by letting the heating temperature of the lower electrode 42 to be 500° C. which is lower than the heating temperature of the diffusion preventing layer 41, it is further possible to reduce the amount of diffusion of the metal atoms from the vibration plate 40 when the lower electrode 42 is heated.

The present invention is not restricted to the embodiment described above and various modifications are possible. For example, in the embodiment, the diffusion preventing layer 41 is heated at 750° C., but the heating temperature of the diffusion preventing layer 41 may be a temperature other than 750° C., provided that the heating temperature is lower than 850° C. which is the heating temperature of the annealing process. However, for relieving sufficiently the residual stress of the diffusion preventing layer 41 before the annealing process, it is preferable to set the heating temperature of the diffusion preventing layer 41 to be 500° C. or higher than 500° C. as it has been described in the embodiment.

Similarly, the heating temperature of the lower electrode 42 may be a temperature other than 500° C., provided that the heating temperature is lower than 850° C. which is the heating temperature in the annealing process. At this time, the heating temperature of the lower electrode 42 may be the heating temperature of the diffusion preventing layer 41 or higher. However, for reducing the amount of diffusion of the metal atoms forming the vibration plate 40 when the lower electrode 42 is heated, it is preferable that the heating temperature of the lower electrode 42 is lower than the heating temperature of the diffusion preventing layer 41 as it has been described in the embodiment.

In the embodiment, the diffusion preventing layer 41 is formed by the AD method, but the diffusion preventing layer 41 may also be formed by other method such as the sputtering method. Even in this case, the residual stress is developed in the diffusion preventing layer 41 when the diffusion preventing layer 41 is formed. However, by relieving the residual stress in advance by heating the diffusion preventing layer 41 before forming the lower electrode 42 and the piezoelectric layer 43, it is possible to make the change, in the internal stress of the diffusion preventing layer 41 due to heating in (during) the annealing process thereafter, to be small, and the exfoliation of the lower electrode 42 and the cracking of the piezoelectric layer 43 hardly occur.

Moreover, the diffusion preventing layer 41 is formed of alumina, but the diffusion preventing layer 41 may be formed of a material other than alumina, such as a metallic oxide. However, for stopping assuredly the metal (atoms) diffused from the vibration plate 40 at the diffusion preventing layer 41, it is preferable that the diffusion preventing layer 41 is formed of a material having a dense structure, such as zirconia and titania, which is chemically stable with respect to the metal atoms which are diffused, and which has no effect on a composition of the piezoelectric material. In general, melting temperature of zirconia is higher than 1500° C. Since the heating temperature of the stacked body of the plates 21 to 23, the vibration plate 40, and the diffusion preventing plate 41 is lower than the melting temperature of zirconia, zirconia does not melt during the heating of the stacked body.

Moreover, in the embodiment, after the lower electrode 42 has been formed and heated, the piezoelectric layer 43 is formed and annealed. However, the lower electrode 42 may not be heated before forming the piezoelectric layer 43. Even in this case, since the residual stress of the diffusion preventing layer 41 is relieved in advance by heating the diffusion preventing layer 41 before forming the lower electrode 42 and the piezoelectric layer 43, the change in the internal stress of the diffusion preventing layer 41 due to the heating in the annealing process is small. Consequently, the exfoliation of the lower electrode 42 and the cracking of the piezoelectric layer 43 hardly occur (refer to FIG. 13) as it has been described in the embodiment (second example).

Moreover, in the embodiment, the piezoelectric layer 43 is formed by the AD method, but the piezoelectric layer 43 may be formed by a method other than the AD method. For example, even when the piezoelectric layer 43 is formed by a sol-gel method, it is necessary to crystallize the piezoelectric material by heating at about 600° C. after the piezoelectric layer 43 is formed. Therefore, by relieving the residual stress of the diffusion preventing layer 41 and the lower electrode 42 in advance by heating the diffusion preventing layer 41 and the lower electrode 42 before forming the piezoelectric layer 43, the exfoliation of the lower electrode 42 from the diffusion preventing layer 41 and the cracking of the piezoelectric layer 43 hardly occur similarly as in the embodiment at the time of the heating for crystallizing the piezoelectric layer 43. In this case, the diffusion preventing layer 41 and the lower electrode 42 are heated at a temperature lower than a heating temperature at the time of crystallizing the piezoelectric layer 43.

Moreover, in the embodiment, the diffusion preventing layer 41, the lower electrode 42, the piezoelectric layer 43, and the upper electrode 44 are formed on the upper surface of the vibration plate 40 after joining the plates 21 to 23 and the vibration plate 40. However, the piezoelectric actuator 32 may be joined to the upper surface of the cavity plate 21 by an adhesive etc. after producing the piezoelectric actuator 32 by forming the diffusion preventing layer 41, the lower electrode 42, the piezoelectric layer 43, and the upper electrode 44 on the upper surface of the vibration plate 40 by steps similar to steps S102 to S108 (refer to FIG. 6) in the embodiment.

An example in which the present invention is applied to a piezoelectric actuator which applies a pressure to the ink in the pressure chamber 10 of the ink-jet head 2 has been described above. However, the present invention is also applicable at the time of producing a piezoelectric actuator which is used for driving other apparatuses provided that it has a structure in which a substrate made of a metallic material, a diffusion preventing layer, an electrode, and a piezoelectric layer are stacked in this order.

What is claimed is:

1. A method for producing a piezoelectric actuator, comprising:
    forming a diffusion preventing layer, on one surface of a substrate formed of a metallic material, for preventing a diffusion of a metal from the substrate by colliding particles of metallic oxide with the one surface of the substrate to deposit the particles on the one surface of the substrate;
    heating the diffusion preventing layer at a first temperature after forming the diffusion preventing layer by colliding the particles of metallic oxide with the one surface of the substrate;
    forming an electrode on a surface of the diffusion preventing layer, the surface of the diffusion preventing layer not facing the substrate;
    forming a piezoelectric layer of a piezoelectric material on a surface of the electrode, the surface of the electrode not facing the diffusion preventing layer; and
    annealing the piezoelectric layer at a second temperature, wherein the first temperature is lower than the second temperature,
    wherein heating the diffusion preventing layer at the first temperature is performed prior to forming the piezoelectric layer of the piezoelectric material, and
    wherein after the electrode has been formed and before the piezoelectric layer is formed, a residual stress in the diffusion preventing layer is relieved by the heating of the diffusion preventing layer at the first temperature.

2. The method for producing the piezoelectric actuator according to claim 1, wherein the diffusion preventing layer is formed by an aerosol deposition method.

3. The method for producing the piezoelectric actuator according to claim 2, wherein the diffusion preventing layer is formed of a metallic oxide.

4. The method for producing the piezoelectric actuator according to claim 3, wherein the diffusion preventing layer is formed of at least one of alumina and zirconia.

5. The method for producing the piezoelectric actuator according to claim 4, wherein the first temperature is lower than at least one of a melting temperature of alumina and a melting temperature of zirconia.

6. The method for producing the piezoelectric actuator according to claim 4, wherein the first temperature is not lower than 500° C.

7. The method for producing the piezoelectric actuator according to claim 1, further comprising relieving a residual stress in the electrode by heating the electrode at a third temperature after the electrode has been formed and before the piezoelectric layer is formed, wherein the third temperature is lower than the second temperature.

8. The method for producing the piezoelectric actuator according to claim 7, wherein the third temperature is lower than the first temperature.

9. The method for producing the piezoelectric actuator according to claim 1, wherein the piezoelectric layer is formed by an aerosol deposition method.

10. A method for producing a piezoelectric actuator, comprising:
    joining a substrate to an upper surface of a channel unit,
    forming a diffusion preventing layer, on one surface of the substrate, for preventing a diffusion of a metal from the substrate by colliding particles of metallic oxide with the one surface of the substrate to deposit the particles on the one surface of the substrate;
    heating the diffusion preventing layer at a first temperature after forming the diffusion preventing layer by colliding the particles of metallic oxide with the one surface of the substrate;
    forming an electrode on a surface of the diffusion preventing layer, the surface of the diffusion preventing layer not facing the substrate;
    forming a piezoelectric layer of a piezoelectric material on a surface of the electrode, the surface of the electrode not facing the diffusion preventing layer; and
    annealing the piezoelectric layer at a second temperature, wherein the first temperature is lower than the second temperature,
    wherein heating the diffusion preventing layer at the first temperature is performed prior to forming the piezoelectric layer of the piezoelectric material, and
    wherein after the electrode has been formed and before the piezoelectric layer is formed, a residual stress in the diffusion preventing layer is relieved by the heating of the diffusion preventing layer at the first temperature.

* * * * *